United States Patent [19]

Hill

[11] 4,219,705
[45] Aug. 26, 1980

[54] SOUND PRODUCTION USING LARGE VOLUME PLASMAS

[76] Inventor: Alan E. Hill, Box 5444A Rte. 5, Albuquerque, N. Mex. 87123

[21] Appl. No.: 893,667

[22] Filed: Apr. 5, 1978

[51] Int. Cl.² .......................................... H04R 23/00
[52] U.S. Cl. ................................................. 179/113
[58] Field of Search ....................................... 179/113

[56] References Cited

U.S. PATENT DOCUMENTS

| | | | |
|---|---|---|---|
| 3,022,385 | 2/1962 | Panay | 179/113 |
| 3,185,778 | 5/1965 | Giannini et al. | 179/113 |
| 3,476,887 | 11/1969 | Seligson et al. | 179/113 |
| 3,516,286 | 6/1970 | Babcock et al. | 179/113 |

FOREIGN PATENT DOCUMENTS

| | | | |
|---|---|---|---|
| 303175 | 1/1930 | United Kingdom | 179/113 |
| 659796 | 10/1951 | United Kingdom | 179/113 |

*Primary Examiner*—James W. Moffitt
*Attorney, Agent, or Firm*—Donald P. Smith

[57] ABSTRACT

Apparatus for use in producing sound waves directly from electrical-acoustical and thermal acoustical energy. The invention embodies precisely controlled large volume plasmas which are capable of radiating very high levels of sound energy.

37 Claims, 20 Drawing Figures

SOUND PRODUCTION USING LARGE VOLUME PLASMAS

BACKGROUND OF THE INVENTION (1) Field of the Invention

The invention relates to methods and apparatuses for sound production using large volume plasmas wherein transient phenomena are reproduced without time lag or distortion because of the lack of inertia of the active medium. In addition, the frequency response is flat and free from resonances.

(2) Description of the Prior Art

Various sound production systems, or speakers, are known in the art and applicant knows of two massless diaphragm speakers. One of these uses an acetylene flame seeded with Na produced by melting glass to give a conducting path. Electrodes positioned in the flame introduce an audio modulated direct current. This system requires extremely high temperatures to obtain the ionization, and the lack of control over the heat distribution makes the system unacceptable for commercial use. Another system comprises an audio modulated microwave generator which produces a very small spherical plasma, bounded by a quartz cavity, which is positioned in an exponential form. This system is limited in frequency response and output energy because of the very small plasma size, and horn loading is necessary to give a reasonable output intensity.

Applicant is aware of the following listed prior art U.S. Pat. Nos. which do not appear to teach or even suggest the invention claimed herein: 2,403,990, Mason; 2,483,768, Hershberger; 2,836,033, Marrison; 3,230,506, Hellund; 3,286,226, Kearshey et al; 3,371,309, Rich.

Hershberger suggests a sound generator comprising an absorptive gas confined within an enclosure and which is irradiated by microwaves modulated at an audio frequency.

Rich discloses an acoustic wave generator which creates compressional waves in response to changes in temperature created by a current source.

Hellund shows a transducer for generating pulses in an electrically conducting liquid.

Mason reveals a spark gap transducer for generating acoustical waves.

Marrison shows a heat controlled acoustic wave system wherein heat is applied to, and extracted from, a confined fluid column to create oscillations in the fluid.

Kearshey et al discloses a spark-discharge sound system for use underwater.

SUMMARY OF THE INVENTION

The invention relates to a method and apparatus for controlling the shape, temperature distribution, pressure, density, and electrical conductivity of plasma in air and for radiating sound energy by modulating the plasma by a signal.

It is accordingly an object of the invention to provide a sound energy radiating system.

It is another object of the invention to provide a sound energy radiating system wherein the shape, temperature distribution, pressure, density, and electrical conductivity of a plasma is controlled and modulated.

It is yet another object of the invention to provide a sound energy radiating system wherein a controlled and modulated plasma is thin compared to the shortest wavelength to be radiated and is large in area to radiate a desired pressure level.

It is yet still another object of the invention to provide a method of controlling the shape, temperature distribution, pressure, density and electrical conductivity of plasma in air whereby thermal gradients and density gradients are formed.

It is yet still another object of the invention to provide a method of controlling the shape, temperature distribution, pressure, density and electrical conductivity of plasma in air by applying thermal energy thereto.

It is a further object of the invention to provide a sound energy radiating system wherein a plasma is formed between a plurality of spaced electrodes, a heated gas is applied to the plasma, and the plasma is modulated by an audio signal.

It is yet further an object of the invention to provide a sound energy radiating system wherein a modulated and heated plasma system includes apparatus for heat removal to provide an equilibrium system operating temperature.

BRIEF DESCRIPTION OF THE DRAWINGS

A detailed description of the invention will be made with reference to the accompanying drawings wherein like reference characters designate like, or corresponding, parts in the several figures.

DESCRIPTION OF PREFERRED EMBODIMENTS

The following detailed description is of the best methods, and structures, and modes of carrying out the invention. The description is not to be taken in a limiting sense, but is made for the purpose of illustrating the general principles of the invention. The scope of the invention is defined by the appended claims.

Reference is here made to U.S. Patent Office Disclosure Document Ser. No. 068168 received Feb. 6, 1978 which reveals evidence of the conception and actual reduction to practice of the invention disclosed and claimed herein.

The embodiments of the invention to be hereinafter described incorporate large volume plasmas which are precisely controlled with respect to shape, temperature distribution, and electrical conductivity and are thus capable of radiating large amounts of sound energy without horn loading over a wider frequency range and with less distortion than can be done with prior art methods and structures.

As hereinafter used, the term plasma is defined as follows:

Plasma: An assembly of ions, electrons, neutral atoms, and molecules in which the motion of the particles is dominated by electromagnetic interactions. A plasma is effectively neutral. Thus, there are equal numbers of positive and negative charges in every microscopic volume of a plasma. A plasma is a conductor and interacts with electromagnetic fields.

The structures and methods hereinafter described produce sound waves directly from an electrical-acoustical or thermal-acoustical energy conversion in air, and without the use of mechanically vibrating structure. Due to plasma's lack of inertia, transient phenomena may be reproduced without the distortion and time lag which characterizes conventional loudspeakers. The frequency response is flat and free from resonances, and the intermodulation and harmonic distortion is significantly reduced as compared against conventional loudspeakers. There is no refraction wave associated with a compression wave, and accordingly, conventional enclosures are not necessary. Therefore, coloration caused by box-resonance, and harmonic distortion caused by pressure loading are eliminated.

The system radiates a nearly perfect hemispherical wave front over its entire frequency range, which produces superior interferometric stero imaging when used in a pair for stereophonic reproduction.

The analysis which follows will serve as the background and foundation for the later described physical structures which are depended upon to reduce the invention to practice.

Figures 1, 2, 3, 6, 7:
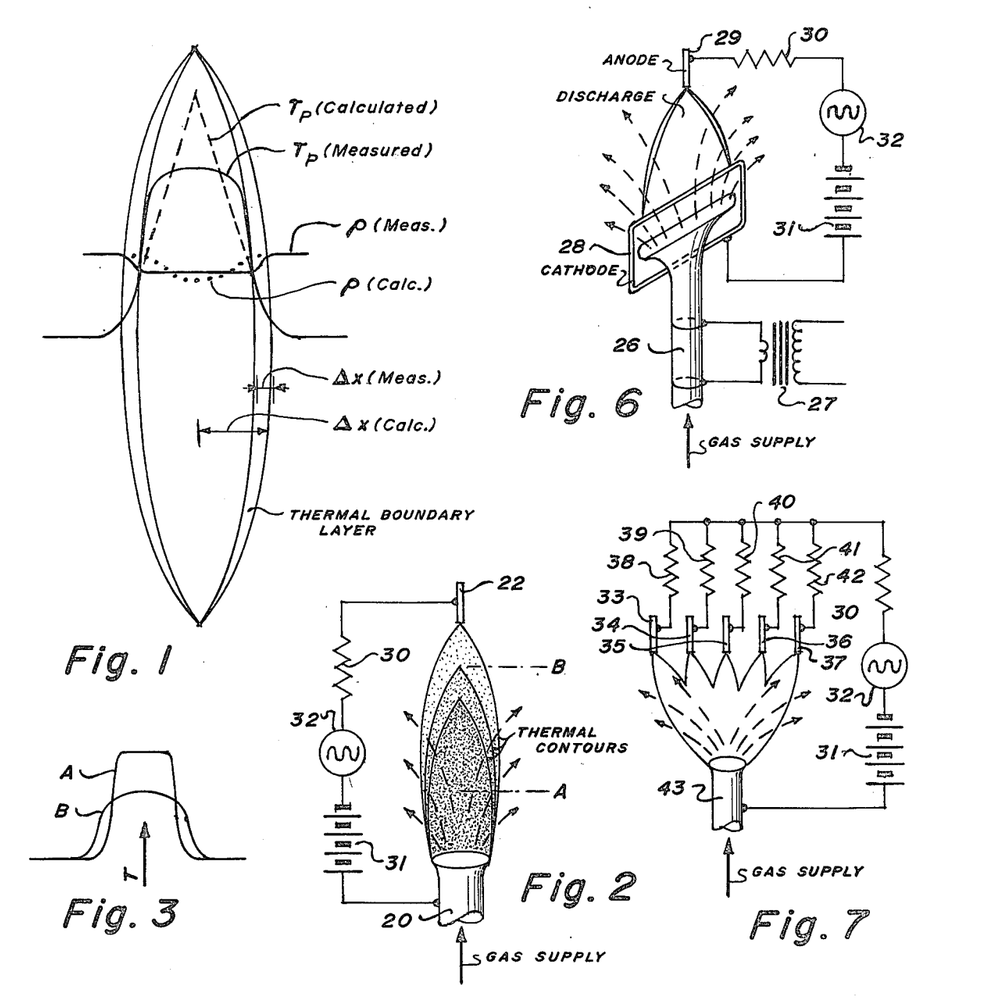
FIG. 1 is an elevation view of a plasma illustrating the energy conditions therein.
FIG. 2 shows, partly in elevation and part diagrammatically, a plasma in accordance with the invention.
FIG. 3 is a graph showing the energy conditions of the plasma of FIG. 2.
FIG. 6 shows, partly in perspective and partly diagrammatically, another embodiment of the invention.
FIG. 7 shows, partly in perspective and partly diagrammatically, yet another embodiment of the invention.

It is the inherent to form a plasma sheath which is thin compared to the shortest wavelength to be reproduced (corresponding to 20 MHz), and large enough in area to radiate any desired sound pressure level without resorting to horn loading. The sheath may be curved to widen the angular distribution of the radiation pattern if its area is large compared to the wavelengths of interest. This follows from the fact that diffraction alone will not provide the desired hemispherical pattern. The ionization level of the plasma can be controlled by an external irradiating source such as an electron beam, or by means of an electric field. But in either case, there will be an applied electric field which serves to add thermal energy to the plasma sheath. The plasma has a hot interior with steep thermal gradients along the boundary surface contiguous the ambient air as illustrated in FIG. 1. Thermal energy (heat) flows across the boundary surface driven by the thermal gradients, and by forced convection, so that the heat input and output are balanced and the temperature (T) is not changing with time. There is also a density gradient ($\rho$) which is inversely proportional to the temperature gradient so that the hot plasma is slightly less dense than the ambient air, but at the same pressure, pursuant to the Ideal Gas Law.

$$\frac{P_2}{P_1} = \frac{\rho_2}{\rho_1} \cdot \frac{T_2}{T_1} \qquad (1)$$

where P, $\rho$, T are pressure, density, and temperature, respectively, and subscripts 1, 2 refer to initial and final values, respectively.

Now, say that the rate of energy flow into the plasma is changed, for example, increased. If the change is gradual, the plasma will simply reach a new temperature, change slightly in volume, and become less dense, but the pressure inside will still match the pressure outside. However, if the change is rapid enough so that outflowing heat transfer cannot follow this change while it occurs, then there will be a momentary pressure change, which in the adiabatic limit may be expressed as:

$$\frac{P_2}{P_1} = \frac{\rho_2}{\rho_1} \text{ where } \gamma = \frac{C_p}{C_v}; \qquad (2)$$

$C_p$ = specific heat at constant pressure
$C_v$ = specific heat at constant volume Thus, if we adiabatically step from $T_1$ to $T_2 = T + \delta T$ with an associated pressure change from $P_1$ to $P_2 = P + \delta P$ we can show from (1) to (2) that:

$$\frac{\delta P}{P} = \left(\left(1 + \frac{\delta T}{T}\right)^{\frac{\gamma}{\gamma-1}}\right) - 1 \qquad (3)$$

and using the expansion:

$$(1 + x)^n = 1 + nx + \frac{n(n-1)}{2!} x^2 + \frac{n(n-1)(n-2)}{3!} x^3 \ldots$$

it is evident that equation (3) can be approximately simplified to:

$$\frac{\delta P}{P} \approx \left(\frac{\gamma}{\gamma - 1}\right) \frac{\delta T}{T} \qquad (4)$$

with only a 1.2% error with temperature fluctuations as high as $$\frac{\delta T}{T} = .01$$

(a value we shall not approach in this case). These pressure fluctuations will launch acoustic waves of energy intensity:

$$\frac{W}{m^2} = \frac{<\delta P>^2}{\sqrt{\rho_o \gamma P_o}} \quad \frac{watts}{meter^2} \quad (5)$$

where $<\delta P>$ is the root-mean-square averaged magnitude of the pressure fluctuations and $\rho_o$, $P_o$ are ambient density and pressure, respectively. Hence, to the extent conditions are adiabatic, we can relate the radiated acoustic power to temperature fluctuations according to:

$$\frac{W}{m^2} = \frac{P_a^2 \left( < \left( \left(1 + \frac{\delta T}{T}\right) > ^{\frac{\gamma}{\gamma-1}} - 1\right) > \right)^2}{\sqrt{\rho_o \gamma P_a}} \quad \text{or} \quad (6)$$

$$\frac{W}{m^2} \simeq \frac{P_a^2 \left(\frac{\gamma}{\gamma-1}\right)^2 \left(<\frac{\delta T}{T}>\right)^2}{\sqrt{\rho_o \gamma P_a}} \quad (7)$$

if we use the linearized approximation. It is immediately evident that the efficiency for sound production increases quadradically with a reduction in plasma temperature T (given a constant temperature perturbation $\alpha T$).

We must now determine what $$\frac{\delta T}{T}$$

to insert into Equation (7) in terms of the plasma energy input and the boundary conditions. This is done by solving the heat equation, which has the general form:

$$\frac{dT_{(x,T)}}{d\tau} = \alpha \nabla^2 T_{(x,y)} + \frac{Q'}{\rho C_v} \quad (8)$$

where $\alpha$ is the thermal conductivity, $Q'$ is the heat/unit volume x unit time, T is the temperature and t is the time.

To illustrate we will make some simplifying assumptions about the shape of the temperature distribution. A closed form solution is then possible which will reveal the salient physical facts. Specifically, we assume the heat is appearing out of a thin slab at the center of the plasma, and is conducted through a linear temperature gradient at each surface to the surrounding air, as shown in FIG. 1. In addition, it is assumed that heat can be carried away by convection of gas sweeping through the plasma at velocity $\vec{v}$. Although inconsistent with the heat dissipation assumption, the energy dissipation is considered to be uniform throughout the plasma volume. The major consequence of this inconsistency is an underestimation of the temperature by a factor of, at most, two. But this will allow direct one-dimensional integration of the heat equation and most of the physical significance will be preserved.

The heat equation (8) can be re-expressed in terms of a temperature perturbation T, the energy input, and heat losses (including both thermal conduction and convection) as:

$$\frac{\partial T}{\partial \tau} = \frac{10^6 \vec{j} \cdot \vec{E}}{\rho_o C_v} \left(\frac{T_p}{T_o}\right) (1 + \mu \sin \omega \tau) - \left[\frac{K}{(\Delta x)^2 \rho_o C_v} \frac{T_p}{T_o} + \frac{\vec{v}}{\Delta x}\right] (T - T_o) \quad (9)$$

Upon differentiating and using the transformation $T_{(\tau)} = T_p + T_{(\tau)}$ this takes the form:

$$\frac{\partial^2 \delta T_{(\tau)}}{\partial \tau^2} + A' \frac{\partial \delta T_{(\tau)}}{\partial \tau} = B' \omega \cos \omega \tau \quad (10)$$

where $$A' = \frac{K}{(\Delta x)^2 \rho_o C_v} \left(\frac{T_p}{T_o}\right) + \frac{\vec{v}}{\Delta x} = \text{thermal relaxation time constant} \quad (11)$$

and $$B' = \frac{10^6 \vec{j} \cdot \vec{E}}{\rho_o C_v} \mu \left(\frac{T_p}{T_o}\right) = \text{energy input} \quad (12)$$

where
$\omega = 2\pi f$, f = drive frequency
$\mu$ = modulation factor
$P_a$ = atmospheric pressure = $10^5$ neutrons/m$^2$
$P_o$ = atmospheric density = 1.24 ng/m$^3$
$T_o$ = outside temperature = 300° K.
$\gamma = 1.4 = C_p/C_v$
v = gas flow velocity through plasma
$\Delta x$ = plasma thickness, center to outside boundary
$T_{(\tau)}$ = temperature (°K.)
$\tau$ = time, sec.
K = thermal conductivity of the plasma
$\vec{j}$ = plasma current density
$\vec{E}$ = plasma electric field The steps required to solve (10), (11), and (12) are deemed to be too lengthy to be included, so the solution will be stated. Subject to the boundary conditions of FIG. 1, the solution is $$\frac{\delta T}{T} = \frac{\omega B'}{(A'^2 + \omega^2)} e^{-A'T} + \frac{B'}{\sqrt{A'^2 + \omega^2}} \left[\sin\left(\omega T + \arctan\left(-\frac{\omega}{A'}\right)\right)\right] \quad (13)$$

where $$B' = \frac{10^6 \vec{j} \cdot \vec{E}}{\rho_o C_v} \mu \left(\frac{T_p}{T_o}\right) \text{ and}$$

$$A' = \frac{K}{(\Delta x)^2 \rho_o C_v} \left(\frac{T_p}{T_o}\right) + \frac{v}{\Delta x}$$

Hence, the final answer for the radiated acoustic power in watts/m$^2$ may be expressed as:

$$\frac{W}{m^2} = \frac{P_o^2}{4\pi \sqrt{\rho_o B_o}} \left[ \left[ 1 + \left( \frac{2\mu A'}{B'} \right) \left( \frac{\omega}{A'^2 + \omega^2} \right) \left( e^{-AT} - \cos(\omega\tau) \right) + \frac{2\mu A'^2}{(A^2 + \omega^2)} \sin(\omega\tau) \right]^{\frac{\gamma}{\gamma-1}} - 1 \right]^2 \quad (14)$$

in terms of the thermal relaxation time constant A' and the energy input B'. A physical insight may be gained by examining the equation in its most detailed form, which is:

$$\frac{W}{m^2} = \quad (15)$$

$$\left\{ \frac{P_a}{4\pi \sqrt{\rho_o B_o}} \left\{ \left[ 1 + \left[ \frac{2 \times 10^{-6} C_v}{\frac{T_e}{T_o}(\Delta x)\vec{j} \cdot \vec{E}} \left( \frac{K \frac{T_e}{T_o}}{\rho C_v \Delta x} + v \right) \right] \times \right. \right. \right.$$

$$\left( \frac{\omega}{\frac{1}{\Delta x} \left( \frac{K \frac{T_e}{T_o}}{\rho C_v (\Delta x)^2} + v \right)^2 + \omega^2} \right) \times$$

$$\left( e^{-\frac{1}{\Delta x} \left( \frac{K}{\rho C_v \Delta x} + v \right)\tau} - \cos \omega\tau \right) +$$

$$\left. \left. \frac{2\mu \left( \frac{1}{\Delta x} \left( \frac{K \frac{T_p}{T_o}}{\rho C_v \Delta x} + v \right) \right)^2}{\frac{1}{\Delta x} \left( \frac{K \left( \frac{T_R}{T_o} \right)}{\rho C_v \Delta x} + v \right)^2 + \omega^2} \sin(\omega\tau) \right]^{\frac{\gamma}{\gamma-1}} - 1 \right\}^2$$

For example, the $\vec{j} \cdot \vec{E}$ in the denominator shows that sound reproduction becomes more inefficient as more direct current power is applied, or as the average plasma temperature is raised. However, greater linearity can be achieved at this expense. These equations are only valid as long as relatively little thermal energy is conducted out of the plasma on the time scale of an acoustical perturbation. Hence, for a given physical geometry there will be an audio frequency $f_L$ below which the sound production intensity will fall. At this point the adiabatic assumption that $P \simeq \rho^\gamma$ is no longer true, and instead $\rho$=constant (=atmospheric pressure) in the limit where the frequency approaches zero, hence no acoustic wave is generated.

It may be shown that the quantity A' of equation (11) is actually the time constant for a thermal change to occur, given a sudden change in the drive power $\vec{j} \cdot \vec{E}$ (which is contained in B). That is, if an energy pulse produces a step in temperature $\delta T$ over the normal temperature $T_p$ (where the outside air is at $T_o$), this will decay back to $T_p$ according to:

$$\frac{\delta T}{T_p - T_o} = 1 - e^{-A\tau}, \quad (16)$$

or the time required is $$\delta\tau = -\frac{1}{A} \ln \left( 1 - \frac{\delta T}{T - T_o} \right)$$

where $$A' = \frac{1}{\Delta x^2} \frac{K}{\rho_o C_v} \left( \frac{T_p}{T_o} \right) + \frac{v}{\Delta x}$$

Figure 4:
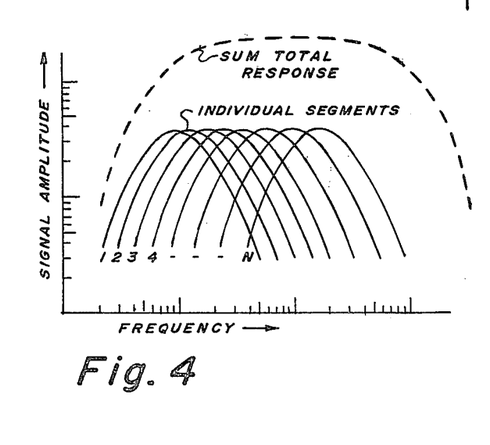
FIG. 4 is a graph showing the relationship between amplitude and frequency of the sound production system.

This invention reveals methods and structures for incrementally distributing different values of these physical parameters spatially throughout the electrical discharge volume so that each spatial increment generates a different frequency response curve as shown in FIG. 4.

We desire uniform frequency response between two limiting values $f_l$ and $f_h$, so the distribution of curves in FIG. 4 must produce the same amplitude at any frequency when integrated (i.e., summed or averaged) over the entire discharge volume.

In general W of equation (15) may be expressed as a volume integration over an appropriate distribution function $(A_{(x,y,z)})$ as:

$$\frac{W}{m^2} = \int \int \int W_{(x,y,z)} dx dy dz$$

but $W = W_{(A)}$ and $A' = A'_{(\Delta x, T1(\Delta x))}$ and $\Delta x = \Delta x_{(x,y,z)}$ so the distribution function is simply the chain derivative of equation (15) with all of the spatial variances included. Thus, one may expect the sound production to diminish when the quarter cycle time becomes substantially longer than the heat transfer time constant, or for $$T_s = \frac{1}{4f} > \frac{1}{A'}, \text{ or for } f < \frac{A'}{4}.$$

On the other hand, it is clear from equation (15) that the production efficiency also falls for $f > A/4\pi$ since the amplitude of the wave is $$\frac{B}{\sqrt{A'^2 + \omega^2}}.$$

Figure 5:
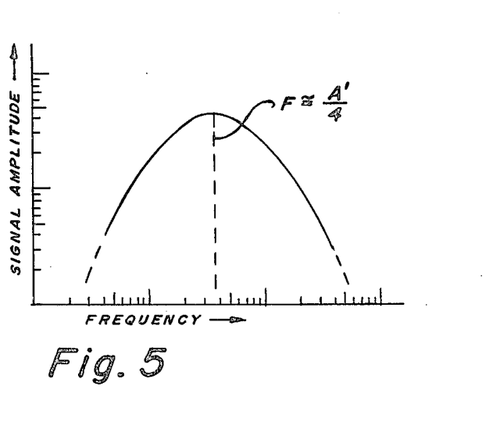
FIG. 5 is a graph showing the relationship between amplitude and frequency of a single increment of the graph of FIG. 4.

Physically, this occurs because the positive and negative cycles of the thermal perturbation cancel each other more and more as the time period $T_s$ becomes short compared to the thermal transfer time $1/A'$. The result is that for a physical geometry (i.e., specific $x,v,T_p,K$) the frequency response will have the general shape shown in FIG. 5.

If we consider a spatial variation along only one direction (i.e., the electric field direction z) and assume symmetry about the other two orthogonal coordinates, the criterion may be stated formally as:

$$\frac{W}{m^2} = \int \frac{d}{dz} dz = \quad (17)$$

-continued $$\int_{z=0}^{d_1} \left( \frac{\partial}{\partial A'} \frac{\partial A'}{\partial (\Delta x)} \frac{\partial (\Delta x)}{\partial z} + \frac{\partial}{\partial A'} \frac{\partial A'}{\partial T_p} \frac{\partial T_p}{\partial z} \right) dz$$

such that W/m² = constant, independent of f between $f_l$ and $f_h$.

$$\frac{\partial}{\partial A'}, \frac{\partial A'}{\partial (\Delta x)}, \text{ and } \frac{\partial A'}{\partial T_p}$$

are known from (15) so it remains to define $$\frac{\delta T}{\delta z} \text{ and } \frac{\partial \Delta x}{\partial z}$$

such that the above criterion is met. As a particular example, we may designate each incremental volume element along z to reproduce a corresponding incremental part of the frequency spectrum. That is, for any distance z, $A'_z = 4f_z$ for optimum performance at the frequency $f_z$, so we require that $$f_z = f_l + \left( \frac{f_l - f_h}{l} \right) z$$

and vary Δx or v or $T_p$ or any combination thereof such that $$A' = \frac{1}{(\Delta x_z)^2} \frac{K}{\rho C_v} \frac{T_p}{T_o} + \frac{v}{\Delta x} = 4f = \tag{18}$$

$$4 \left( f_l + \left( \frac{\rho_h - \rho_l}{l} \right) z \right)$$

for all z. Then summing over all volume elements from z=0 to l in equation (17) would yield a total power output which is independent of frequency between $f_l$ and $f_h$.

As will later be more fully described, two separate species of electric discharges may be used to produce the plasma which is the working medium for sound production.

1. Self-Sustained Discharge—In this case the electric field must be high enough to cause ionization. This type is illustrated in FIGS. 2, 6, 7, 8, 9, 10 and 11. The electrons and ions are accelerated by the same field that created them, thus producing a current which flows in the discharge volume by means of cathode and anode electrode structures to form the plasma sheath more particularly described above. When not controlled by the methods and means disclosed herein such a discharge will change from the glow phase to the arc discharge phase as is well known in the art, (see for example the work by James D. Cobine Ph.D. entitled "Gaseous Conductors Theory and Engineering Application" Copyright 1958, Published by Dover Publications, New York) and hence will shrink to a small, dense, column because of thermal ionization instabilities and electrode boundary effects.

It is well known that the arc phase of a discharge is very noisy (see page 206 of Dr. Cobine's work) and therefore could not be used in a sound transducer without special control structure. The discharge here is carefully controlled to remain in stable state in the glow discharge phase, even at high pressures (i.e. 1 atmosphere)

2. Externally Ionized Plasma—In this case the plasma does not rely on the electric potential which produces current flow in it to derive its ionization, but instead derives its ionization from an external source such as an electron beam. This type is illustrated in FIGS. 12-20 inclusive. Here the electric field may have any magnitude from zero up to the self-sustaining magnitude and is not clamped to the self-sustaining magnitude. Hence the plasma boundaries, volume, and electron density (potential for current flow) may be entirely controlled by an external ionizing source while its energy may be derived by an electric field which does not interfere with the plasma density or distribution. As more fully stated above, in the Summary of Invention, and explained in the theoretical analysis it is necessary to shape the plasma and its boundary surface in order to generate a uniform frequency response. In addition, the plasma must be thin in the sound propagation direction in relation to the wavelengths of interest, and the plasma must have a large surface area in order to provide the necessary sound intensity.

In the following detailed description the same reference character is used to designate like or corresponding parts.

1. Self-Sustained Discharge

In the self-sustained discharge which produces the plasma, a preheated gas such as air or helium may be introduced into the discharge space and forced through the discharge. In FIG. 2, reference character 20 indicates a hollow tube-like electrode structure connected to voltage source 31. Another electrode 22 is spaced from electrode 20 to define a discharge space, and a ballast resistor 30 and modulating signal source 32 complete the circuit. A pre-heated gas is forced into the discharge space through hollow electrode 20. The hot gas flow provides a hot thermal sheath around the plasma (FIG. 1) which results in a spreading and stabilization of the plasma over a larger volume by lowering the density in its outer regions. FIG. 3 shows the temperature plots at regions A and B. Thus, the spreading and stabilization is caused by a medium (gas) not coupled directly to the discharge itself. The Electric Field/Pressure (E/P) ratio and therefore ionization rate is increased in the outer regions because of the thermally induced density decrease, but this effect does not result in discharge instabilities because the heat added, which produces the effect is external to the discharge and not coupled to the discharge parameters. The externally produced thermal sheath modifies the boundary layer Δx shown in FIG. 1 and appearing in equation (11) and therefore controls the Thermal Relaxation Time Constant (A'). The hot gas spreads as it diverges from electrode 20 relative to the electrically conducting body of the discharge so that, as a result, every discrete area is characterized by a different Thermal Relaxation Time Constant (A'). This spatial spreading of different (A') values broadens the frequency response and can approach very closely the ideal condition for uniform frequency response as expressed in equation (17).

It will be understood that the gas may flow from any source such as a fan, compressor, or storage tank and the heat may be provided by any means. Heat generated in the cathode fall region may be directed to the gas delivery duct to provide the hot boundary sheath.

In FIG. 6 the gas is heated by the I²R loss in metal supply duct 26 connected to step-down transformer 27 which supplies low-voltage high-amperage current. In this embodiment the terminal end of duct 26 is formed to be outwardly flaring to better distribute the heated gas flow into the discharge. Cathode 28 surrounds the flared end, and together with anode 29, spaced therefrom, forms a discharge space. Ballast resistor 30, voltage source 31 and audio modulation source 32 complete the circuit.

FIG. 7 illustrates an embodiment wherein the discharge is spread by using separated individually current-regulated electrodes. A plurality of anodes 33–37 inclusive, each having its respective ballast resistor 38–42 inclusive are spaced from cathode 43. This arrangement spreads the discharge. The regulation is accomplished in the embodiment illustrated by ballast resistors but electronic vacuum tube regulation can be used as a full equivalent. The cathode may also be formed into a plurality of individual segments. The remaining circuit components are the same as in FIG. 6. This arrangement has been found useful in producing odd shaped discharges which create spatial variations in the discharge current density $\bar{j}$ (Equation 12) which, in turn, affects the Thermal Relaxation Time (A'). The shaping is done by the location of the individual electrodes, by using non-equal ballast resistors or other current regulation means or by using an asymmetrical number of cathodes and anodes, or by any combination thereof.

Figure 8:
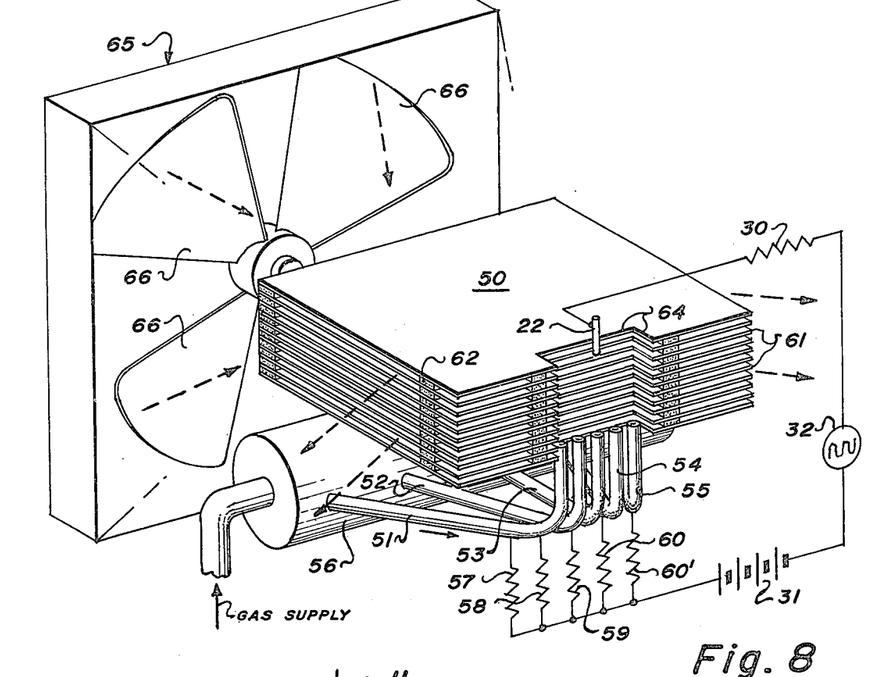
FIG. 8 is a perspective view of the invention showing mechanical and electrical details thereof.
Figure 9:
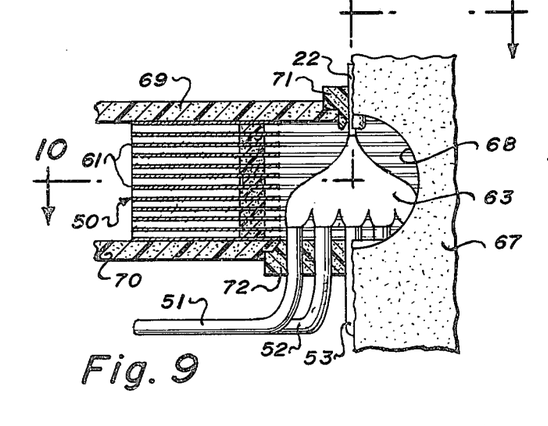
FIG. 9 is an elevation partly in section taken on lines 9—9 of FIG. 10.
Figure 10:
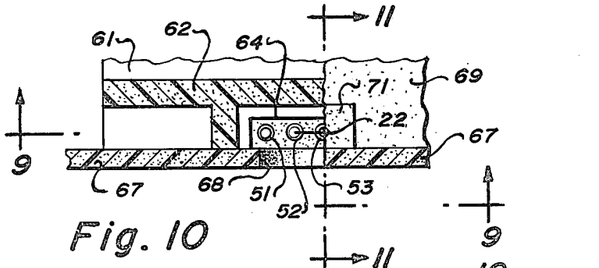
FIG. 10 is a plan view taken on lines 10—10 of FIG. 9.
Figure 11:
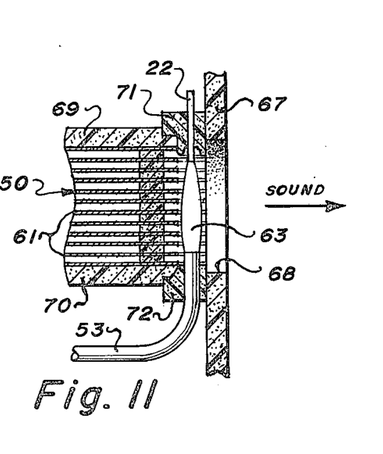
FIG. 11 is a section view taken on lines 11—11 of FIG. 10.

The heat or thermal energy introduced to form thermal gradients and density gradients in the plasma boundary area contiguous the ambient air must be removed from the system at a rate which provides an equilibrium system operating temperature. A preferred method of heat removal in this case is to provide metal plates which may contact the plasma along lines distributed over the entire surface area without shorting the discharge. A laminated structure designated by reference character 50 is shown in the embodiments of FIGS. 8–11 inclusive. Voltage source 31 ballast resistor 30 and source of modulating voltage 32 are schematically shown as identical to the embodiments of FIGS. 2, 6, and 7 and perform the same functions. A plurality of metal tubes 51–55, inclusive, conduct a heated gas from reservoir 56 and function as a laterally spaced array of cathodes. Anode 22 is positioned to form a discharge space, and individual ballast resistors 57–60' are connected to respective individual tubular cathodes as schematically shown in FIG. 8. The separate plates 61 forming the laminated structure are electrically insulated one from another by insulators 62 and are disposed at a right angle to the plane extending between the electrodes, which is the plane of the plasma 63 as seen in FIGS. 9 and 11. The plates are relieved, or cut away, as at 64 as best seen in the perspective view of FIG. 8 to form a plasma cavity. Plates 61 are spaced one from another such that the product of the electric field between individual plates times the spacing does not exceed the cathode fall voltage for the material used. A typical example is 300 volts per plate. The spacing between plates may be uniform as is illustrated or it may be varied with position along the discharge direction to create spatial variations in the thermal transfer rate $\Delta x$ (FIG. 1). This effect will fulfill the conditions of Equations 17 and 18, above, to create a uniform frequency response characteristic. A fan assembly 65 having blades 66 driven from a motor (not shown) forces cooling air in the direction of the arrows in FIG. 8, i.e., into the interstices between the plates and out again, thus carrying off heat to keep the system at a stabilized temperature. Insulating spacers 62 perform a dual function. They provide a baffle to prevent cooling air from entering the plasma cavity and they serve as a backboard for reflection of sound to the forward, or listener, direction. A plate 67 formed from an insulating material may be positioned on the forward, or listener, side of the system. An aperture 68 is formed therein for release of sound energy. Boundary plates 69 and 70 hold the plate assembly in sandwich relation, and support insulating bushings 71 and 72. These are provided to maintain the electrodes in correct mechanical and electrical relationship. The electrode 22 may also be a tube connected to tank 56 to conduct heated gas to the discharge space.

A method of starting the discharge is needed because the electric field required to initiate the discharge is many times greater than that required to sustain ionization in a self-sustained discharge. One way to accomplish this is by means of electronic regulation. Specifically, the distributed metal heat sink 50 or an array of distributed starting pins could be connected through large resistances to the entire potential across the discharge, such that when no discharge current flows, the entire potential is impressed across the bottom electrode and the metal plate or pin nearest to it (there being no IR drop in any resistors). As a result, the discharge strikes to the nearest point and by so doing causes a current to flow through its connecting resistor. The potential therefore falls in the struck region of the discharge but rises between the next two points where it strikes next, and so on. The resistances may be chosen large so that when the entire discharge is struck, very little power is bypassed from the discharge into the starter circuit.

The discharge can also be physically struck by mechanical means. One example can be described. In this case a starting pin supported by a thermal bi-metal strip lever arm arrangement is nearly shorted across the discharge when no power is applied. When the device is turned on an arc establishes across the small gap and the current is channeled through a heating element on the bi-metal strip. The heated strip then bends, lifting the striking pin from the discharge region slowly so that the discharge is formed. The pin is held out of the discharge region until the system is turned off and the bi-metal strip cools. There are many other mechanical alternatives to this arrangement which would suggest themselves to one skilled in the art.

The audio input to the system may comprise a DC voltage power supply connected to the audio signal input (step-up) transformers. A conventional ballast resistor is used with the circuit. Another audio input circuit utilizes a vacuum tube class A amplifier to simultaneously provide high voltage audio and current control. This doubles the electrical efficiency. (both DC and audio) since ballast resistors are eliminated and the audio amplifier tubes perform the current regulator functions. Class A amplifiers are inefficient as used in the past, but here the normally wasted energy is used to power the discharge and only 5–10% of the energy is actually wasted (in tube plate dissipation). Furthermore, the audio transformer is eliminated. (Transformers usually produce quality degradation. Since feedback is not available to the power amplifier to compensate for its deficiencies). When the plasma characteristics have been maximized to provide the flattest possible frequency response characteristics, any additional compensation can be provided as desired by electronic filters preceeding the amplifier circuit. One output tube may be provided for each electrode with no additional ballast required. The DC regulation is provided by means of the IR drop in the cathode resistors of each tube which drives the grid more negative for increasing current. The output from each tube may be subdivided into two or more electrode channels by adding small, supplementary DC ballast resistors.

Starting the system is important, even critical, in commercial applications of the invention where reliability is important. In these cases the gas used is helium, argon or nitrogen. A logic circuit has been found to give satisfactory and reliable starting results. This circuit operates to sense the magnitude of the voltage across the electrodes and the magnitude of the current flowing. If the voltage is within limits but no current is flowing the circuit opens a solenoid valve to admit the gas into the plasma cavity. During normal system operation the sensing of the voltage and current is a continuous monitoring operation which serves to counteract disturbances of the plasma by strong drafts in the ambient air or strong winds during outdoor operation.

2. Externally Ionized Plasma

As previously explained, an externally ionized plasma is one which does not rely on the electric potential which produces current flow in it to derive its ionization, but instead derives its ionization from an external source such as an electron beam. The plasma thus formed is fundamentally different from that presented above in that the electric field may have any value from zero up to the self-sustaining value and is not clamped to the self-sustaining value. Hence, the plasma boundaries, volume, and electron density (or potential for current flow) may be entirely controlled by the external ionizing source, while its energy may be derived by means of an electric field which does not interfere with the plasma density or distribution.

An electron accelerator operates like a large grid-controlled vacuum tube, except that the electrons have sufficient energy, 30 to 120 KEV to penetrate through the thin plate which separates the vacuum chamber from the ambient air. Once outside, each electron creates secondary electron ion pairs/cm at one atmosphere pressure (typically S=50 to 100) until it runs out of energy. (About 30 EV of energy is required for each ionization process.) An electrode and voltage source placed across this conducting plasma provides an electric field which causes a current to flow through the externally ionized gas, but the magnitude of this field is not sufficient to maintain ionization without aid from the external ionizing source. The plasma conduction of this current produces the required heat input in response to the ionization source to control the plasma parameters and to generate sound in accordance with principles outlined in the theory section above.

The electron number density $n_e$ produced by the electron beam $j_b$ may be found by solving the rate equation for steady state conditions:

$$0 = \frac{dn_e}{dt} = \frac{S_a j_b}{e} + \left(\frac{\alpha_T}{P} - \frac{\alpha_a}{P}\right) P^2 v_d n_e - \alpha_r n_e^2 \quad (19)$$

where
$j_b$ = the E-beam current density
$v_d$ = the electron drift velocity
$p$ = the pressure
$\alpha_T, \alpha_a$ = the Townsend ionization and attachment coefficients, respectively
$\alpha_r$ = recombination coefficient
$S_a$ = Secondary ionization cross section ($\approx 50$–$100$)

Its solution is:

$$n_e = \frac{-\left(\frac{\alpha_T}{P} - \frac{\alpha_a}{P}\right) P^2 v_a \pm \sqrt{\left(\left(\frac{T}{P} - \frac{\alpha_a}{P}\right) P^2 v_d\right)^2 - \frac{4\alpha_r j S}{e}}}{2\left(\frac{\alpha_T}{P} - \frac{\alpha_a}{P}\right) P^2 v_d} \quad (20)$$

In the plasma where both $\alpha_r$ and $\alpha_a$ contribute, judicious choice of the gas mixture and $j_b$ can lead to near total dominance of either attachment or recombination, which leads to a simple quadratic or linear dependence of $n_e$ on the beam current $j_b$. A linear system calls for the second condition, in which case:

$$n_e \simeq \frac{S}{e\alpha_a j_b}.$$

If the gas is air, this condition is readily satisfied since, due to $O_2$, the attachment coefficient for $P_2$ dominates $\alpha_r$ by orders of magnitude.

If we then apply an external electric field E, the secondary current which heats the discharge is given by:

$$j_s = n_e e v_d \simeq \frac{S v_d}{\alpha_a j_b} \quad (21)$$

Figures 12, 13, 14:
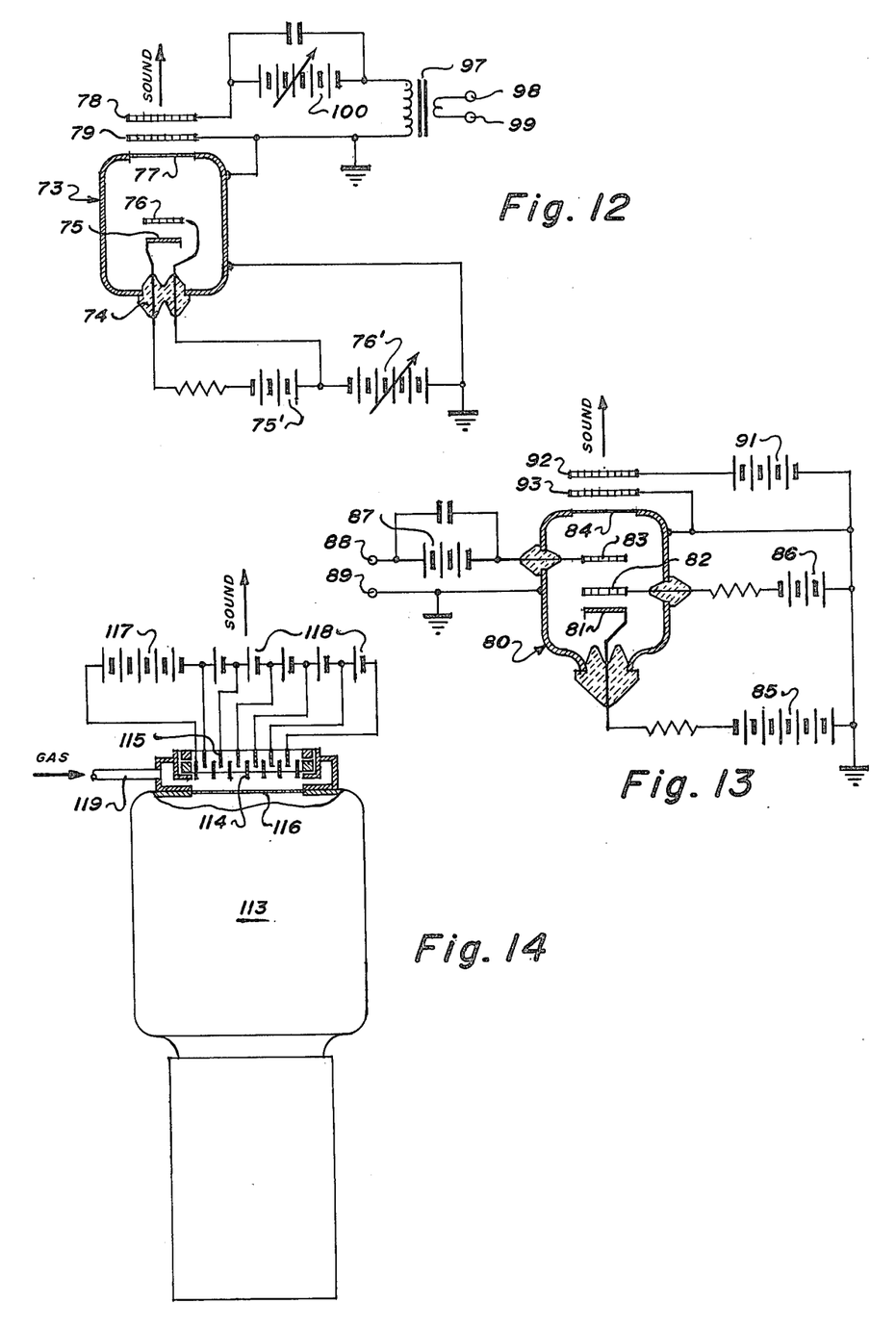
FIG. 12 is a schematic diagram of yet another embodiment of the invention.
FIG. 13 is a schematic diagram of still another embodiment of the invention.
FIG. 14 is an elevation, partly schematic, of yet still another embodiment of the invention.

The modulation of the plasma generated, as described above, may take several forms. Referring now to FIG. 12, reference character 73 designates, generally, an electron beam generator having a grid 76, and a cathode 75. High voltage bushings 74 are provided for the connections to cathode power supply 75' and voltage supply 76'. Plate 77 closes the envelope and is transparent to electrons. Anode 78 and cathode 79 are positioned in the plasma generated and have power supply 100 connected thereto to supply the electric field to cause current flow to heat the plasma. The audio input is connected to terminals 98 and 99 of transformer 97. In the operation of this system, the externally ionized plasma is heated with the bias voltage which has a superimposed AC component containing the audio signal. No ballast or external current control is needed since the electric field is free to change, within limits, as well as the current. The dynamic range, however, is limited and is not entirely linear because $\alpha_T$, $\alpha_a$, $\alpha_r$ are all functions of the applied electric field.

Referring now to FIG. 13 which discloses an improved system reference character 80 designates an electron beam generator. The type illustrated has an internal structure comprising a cathode 81, a plasma cathode 82, a grid 83, and a plate 84 which closes the envelope and is transparent to the electrons. The accelerator power supply is designated as 85, the plasma cathode power supply is designated as 86, the negative grid bias is designated as 87, the audio input is connected to terminals 88 and 89, the power supply for the current to heat the plasma is 91; the anode and cathode assemblies which are positioned in the plasma are designated as 92 and 93 respectively. The system thus disclosed holds the external electric field constant while modulating the electron beam current ($j_e$), therefore modulating the external current, ($i_e$). This modulation system is more linear than the electric field modulation system described previously.

There is no external audio amplifier in this system because the amplifier is the electron beam accelerator itself plus the electron multiplication process in the plasma between primary and secondary ionization. A small audio signal applied to the accelerator grid controls the entire discharge process which may dissipate hundreds of watts.

Referring now to FIG. 14, reference character 113 indicates an electron beam generator, or gun as it is termed by those skilled in the art, anode array 114 and cathode array 115 are positioned in the plasma and are adjacent window 116. Fixed DC voltage source 117 produces the current which heats the plasma and individual anode elements may have different voltages connected thereto as indicated by separate voltage sources 118 to modify the frequency response as desirable. The anode and cathode arrays also function as a heat sink to remove the thermal energy and keep the system, including the window, at a uniform operating temperature. In this connection, cooling air or gas from any source is admitted through tube 119 and the gas exits from the interstices between the arrays in the direction of the sound propagation as indicated by the arrow. This electron beam used is the continuous grid modulated plasma cathode type and requires that the audio signal (approximately 30 volts audio) ride on top of the DC accelerating voltage (20,000 to 100,000 volts). This can be done by fitting an RF transformer assembly into the base of the gun (not shown). A high frequency tuned oscillator circuit produces the required voltage rise across a dielectric core inductor. If coaxial cable is used for the secondary, then the audio signal applied to this cable at the grounded end will ride on top of the full RF potential at the high voltage end. Additional windings at the high voltage end will provide the floating potentials needed inside the gun to bias the grids and create the plasma source. The above connections result in an RF modulated electron beam with an audio carrier. The RF signal may be rectified by well-understood circuitry.

In the embodiments described above, it was explained that the anode and cathode structures are positioned in the plasma generated by the electron beam gun and serve the dual functions of heat sink as well as electric field electrodes. Attention is now called to FIGS. 15-17 inclusive wherein several embodiments of electrode structures are illustrated which serve the dual purposes as above described.

Figure 15:
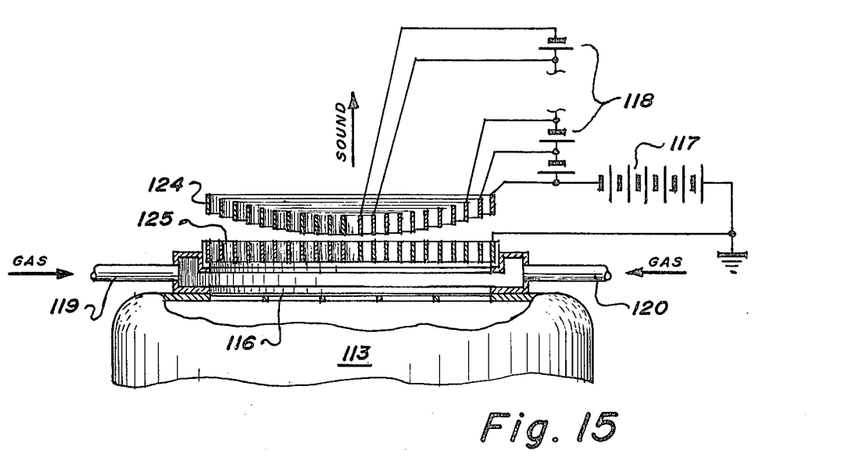
FIG. 15 is a schematic diagram of another embodiment of the invention.

In FIG. 15 reference character 113 again designates the electron beam generator, 119 shows the cooling gas input pipe and 120 shows the cooling gas input pipe. The electron beam penetrates the spaces between anode 124 and cathode 125. Voltage source 117 is provided and individual voltage sources 118 connect separate voltage values to the anode elements. As there shown, the individual elements comprising the anode and cathode are concentric annuli and each ring-like element of the anode is positioned a different distance from its registering cathode element in the vertical plane to distribute the thermal relaxation time over selected values through the discharge.

Figure 16:
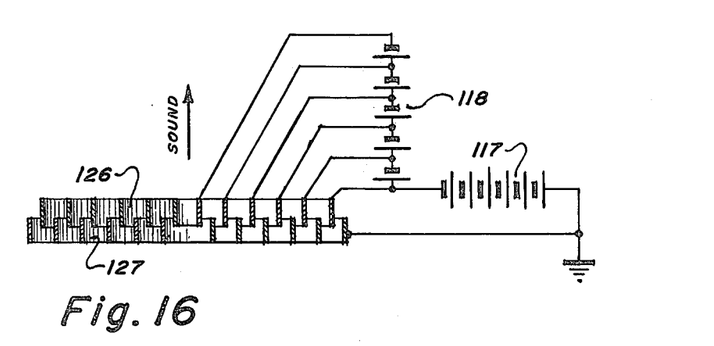
FIG. 16 is a schematic diagram of an electrode structure.

FIG. 16 reveals a different arrangement of anode 126 and cathode 127 structures usable with the beam generators previously discussed. Here the individual anode annular elements are in interdigital relationship with the individual cathode annular elements and the electric field applied thereto can be varied from element to element to distribute the thermal relaxation time over selected values.

Figure 17:
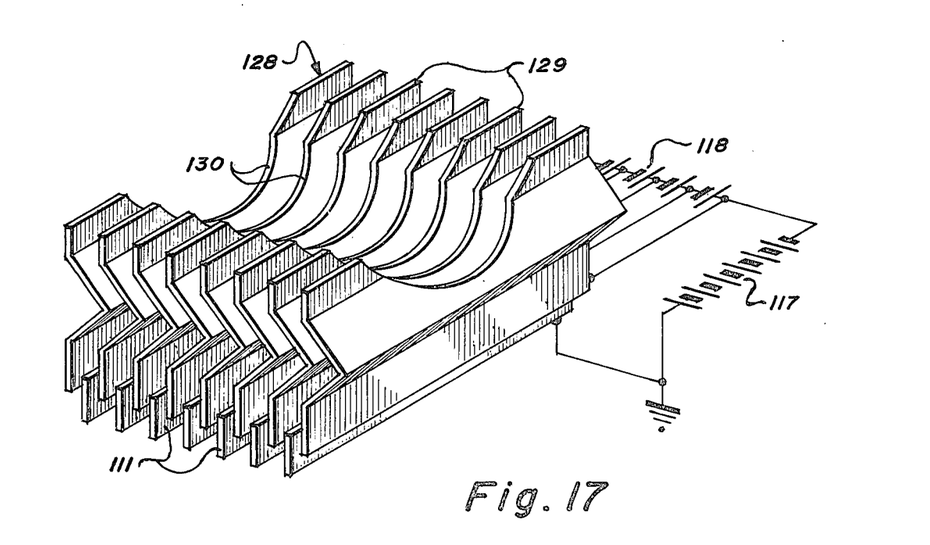
FIG. 17 is a perspective view of an acoustic lens usable with the invention.

FIG. 17 shows an acoustic lens designated generally as 128 which can be used with the beam generators described previously. The lens functions to concentrate the acoustic energy into a desired path to direct the sound intensity into a desired direction. As shown in the figure, plates 129 form the distributed anode and are connected to voltage source 117 through individual voltage sources 118 to impress separate voltage values on separate plates. Members 128 each have a segment removed along an annular path 130. The distributed cathode elements 111 are each connected to the other terminal of voltage source 117.

The lens illustrated is positioned in the plasma generated by the electron beam gun and serves a triple function. First, as electrodes to introduce the electric field into the plasma, second as a heat sink when the cooling gas or air is passed over the elements, and third as a lens to concentrate and direct the sound energy into a desired path and direction.

It is recognized that when high energy electron beams are used large amounts of ozone may be produced and X-rays may be produced when electron-beam voltages exceed 18 KW or if radioactive materials are used for pre-ionization. Special safety precautions must be taken in these cases. A shield or obstruction can of course be used. Alternatively, the gas exiting the discharge region should be passed through or over special chemical catalytic filters to neutralize or trap ozone. Or a very thin membrane capable of transmitting sound might be used to keep all of the gas contained within the device, in which case the gas would probably not be air. For X-ray control, a corrugated metal heat sink-baffle arrangement which would be made part of the electrode structure could be placed between the plasma and the listener. The irregular part would not permit line of sight transmission of X-rays, but would transmit the sound. It could furthermore be shaped into an acoustical lens (FIG. 17) to provide acoustical dispersion. Sufficiently heavy materials, such as lead, could be used where needed to enhance X-ray foil window support structure, onto which a window of less than 0.0001 inch thickness could be deposited and would be strong enough to separate atmospheric pressure from the vacuum inside the electron gun. This would allow transmission of electron beams with energies less than 10 to 29 KV into the discharge area. Only the requirement to penetrate 0.001 inch thick foils made it necessary to use voltages which are high enough to create an X-ray problem.

The sound pressure level of the invention as embodied in the above described structures can be enhanced by the use of aerodynamic techniques. An electron beam controlled electric discharge or any means of acoustically modulated heat addition is placed in a fast flowstream of gas in a channel. The gas exchange time through the discharge, or heated region, must be fast compared to one period of the shortest acoustical wavelength to be produced. The flow is accelerated to a mach number near $$\mu = \frac{1}{\sqrt{\gamma}}$$

where ($\gamma = C_p/C_v$) by means of changing the channel cross sectional area. This velocity increase causes the $$\frac{\delta T}{T}$$

variations generated by the discharge to become aerodynamically transformed into $$\frac{\partial \rho}{\rho}$$

variations which launch acoustic energy. Systems embodying the above principles could be scaled to yield almost unlimited acoustical energy.

Figure 18:
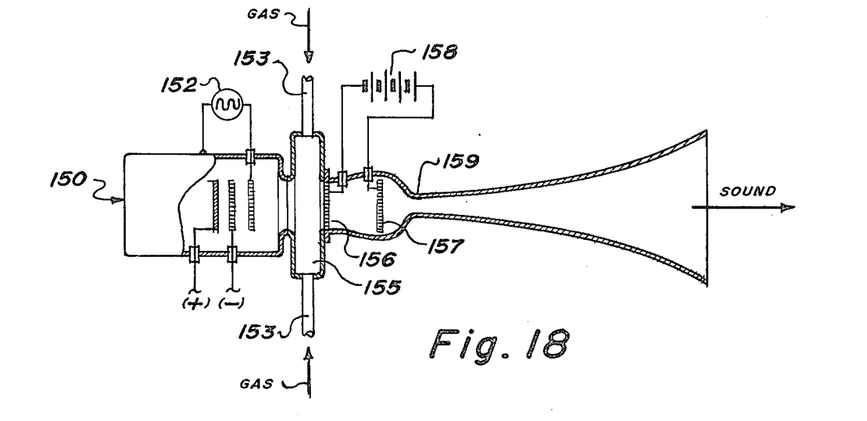
FIG. 18 is a schematic diagram of a sound propagation system embodying the invention and using an aerodynamic technique to enhance the sound pressure level.
Figure 19:
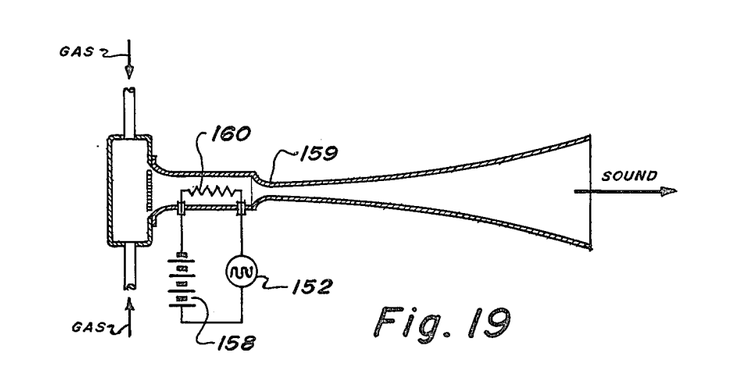
FIG. 19 is a schematic diagram of another embodiment of the aerodynamic technique.
Figure 20:
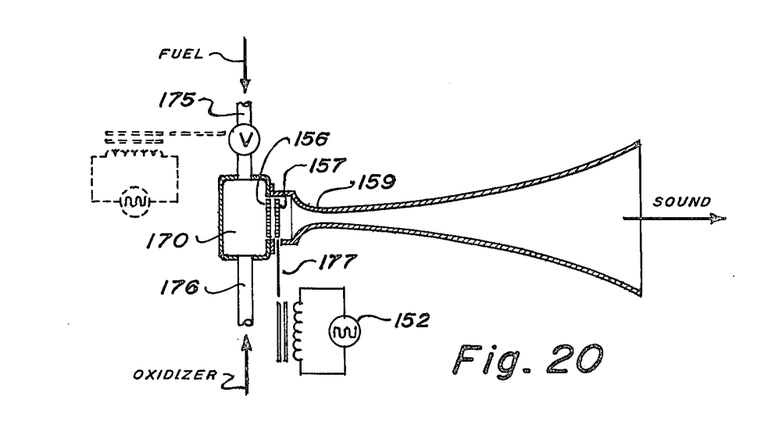
FIG. 20 is a schematic diagram of yet another embodiment of the aerodynamic technique.

Attention is now invited to FIGS. 18-20 inclusive wherein examples of very high intensity sound systems are shown using the aerodynamic techniques.

In FIG. 18, reference character 150 designates a grid modulated electron beam generator, known in the art, and having an audio signal source 152 connected thereto as shown. Gas inlet conduits 153 and 154 direct a gas at a high pressure to manifold 155. Electrodes 156 and 157 connected to power supply 158 provide the electric field for heating the discharge. Venturi tube 159 of well understood dynamic flow characteristics comprises two truncated cones connected at their small ends by a very short cylinder.

FIG. 19 depends upon the same structure as described above but uses an electrically resistive heating element 160 located in the Venturi tube to heat the plasma and modulate it. Power supply 158 and audio signal source 152 are shown connected to the element 160. This species is less efficient and more limited in frequency response but it has simplicity.

A chemical reaction or combustion may be used as shown in FIG. 20. Here the combustion chamber is designated by reference character 170 and has conduits 175 and 176 to admit fuel and oxidizer. Audio signal source 152 and acoustical driver 177 introduce audio energy to electrodes 156 and 157.

There are a number of alternative methods for establishing an externally ionized plasma. Examples of these methods are: radioactive materials, ultraviolet radiation, and rapid controlled electron avalanche.

Heavy isotope materials can be painted onto a solid surface. Secondary ion-electron pairs are constantly generated from any of these types of primary ionizing radiation, and would serve in lieu of the electron accelerator. In this case only the E-field type of modulation is used. The choice of radioactive material would depend on factors involving half life, against achievable secondary ionization rate, cost and safety. $\beta$ emitters are generally safe unless injested into the body. The technology could be incorporated in two ways: (1) as a means of totally externally sustaining the ionization in the plasma or (2) as a means of helping to control the spatial distribution of a discharge which operates at an E/P value near or at the self-sustaining point. For the case (1) $n_e = 10^6$ to $10^9$ could be achieved and would generate a large area, weakly ionized, cold plasma. In this case, an intermediate ionization process could impress the audio signal onto the plasma.

Short wavelength ultraviolet (UV) energy is capable of producing ionization by several mechanisms. Wavelengths which are sufficiently short to produce substantial ionization in air directly will not penetrate the usual windows. However, trace amounts of chemicals may be added to the gas which permits UV wavelength radiation to generate substantial ionization (Javan has shown 1100 Å and 1600 Å radiation will ionize tri-n-propylimene, and there are many other hydrocarbon candidates). Usually types of continuous or rapid pulse electric discharges in various low pressure gases bounded by CaF windows could provide such radiation. Very rapid repetition rate (>50,000 PPS) sequences of extremely short pulses could also be used. These discharges could operate in either of the two modes described above. In either case an externally applied bias field with an audio modulation component would be impressed onto the UV ionized gas. Still another alternative would be to use a continuous, relatively long wavelength UV source (such as a quartz envelope mercury discharge producing 2537 Å) to illuminate a specially processed cathode to produce photoelectron emission from its surface. This type discharge would probably operate at an E/P value which barely sustains ionization with the help of the photocathode source.

Electric discharges can be operated above avalanche electric field conditions over large volumes of high pressure gas (i.e., in air) for very short time periods ($\sim 2^{-5} \times 10^{-8}$ sec.). If the discharges are then repeated at a rate of say, 100,000 discharges/sec., the electrons and ions do not substantially recombine between pulses. A second continuous DC electric field may be impressed onto a plasma created by this means, if its E/P value is below the self-ionization limit. The DC electric field in this system contains an audio modulation component. The system thus described has been actually reduced to practice for laser use. (See: Hill, Alan E., "Continuous Uniform Excitation of Medium Pressure $CO_2$ Laser Plasmas by Means of Controlled Avalanche Ionization", Applied Physics Letters, V. 22, #12, June 15, 1973.)

Some work has been done in the area of using multiple types of discharges simultaneously in cooperation with each other (See: Tulip, J. and Sequin, H.J.J., "High Pressure Glow Discharges Using a Differentially Pumped Cathode", Applied Physics Letters, V. 27, #1, July 1, 1975.) A corona discharge, or radioactive material induced plasma, or highly ballasted Townsend glow discharge, or RF discharge, or microwave discharge, may provide a uniform ionization front from which to strike a more highly ionized discharge. Thus, one type of discharge may provide a distributed gaseous cathode or anode for a second, more intense discharge, thereby controlling its spatial distribution. One can confine each discharge to different operating pressures or gas composition regimes. Specifically, a porous insulating barrier can be used to separate a low pressure large volume, Townsend discharge from the main discharge which produces the sound. The ionized gas diffusing through the membrane provides a distributed electrode surface for the main discharge. Helium is supplied to the controlling discharge which aids in distributing its cathode fall area over a much larger area thereby decreasing its current density. Helium then diffuses through the porous structure, providing a transition region for the discharge plasma properties to readjust to the conditions of an air discharge. A number of discrete hollow cathodes, independently current controlled (by ballast resistors or the like) could be helium pressurized as an alternative to the porous plate method.

Radio frequency or microwave energy as an auxiliary source to aid in stability, or spatial distribution of the main discharge, and to add energy to the main discharge is useful.

The selection of a gas or a mixture of gases used depends on the advantages sought for its use. For example, addition of a gas or a gas mixture to the discharge may be done for the purpose of modifying the ion-electron attachment recombination balance. Attachment rates depend linearly upon the electron number density, hence it is desirable to let this process dominate over the recombination process for ionization loss because the resulting sound reproduction distortion would be less. However, air is extremely attachment dominant and some shift toward recombination dominance would allow greater discharge stability, higher current densities and greater electron production efficiencies. Certain gas additives or substitution for $O_2$ could be used to optimize this balance.

As another example, addition of a gas or a gas mixture to the discharge may be done for the purpose of modifying the Townsend ionization rate. When photo-ionization is used to supplement the discharge, the additive would be chosen to enhance the photoionization cross section. An example of such an additive is tri-n-propylamene. If electron collisions dominate the ionization process, as is the case in avalanche or electron beam discharges, then additives with low ionization potentials, such as sodium, would be used.

Yet another example of the addition of a gas or a gas mixture to the discharge may be done for the purpose of decreasing the thermal conductivity. It is sometimes desirable to lower the thermal conductivity of plasma for three reasons: (1) the maximum value of the thermal delay time is decreased, thereby extending the frequency response limit of the device, (2) the cooler plasma temperature permits the sound production efficiency to increase, and (3) at cooler temperatures the plasma kinetics favors more stable operation of the discharge over larger volumes. Helium is an example of such an additive. Helium will decrease the current density at the cathode thus spreading the discharge over a larger area.

Yet still another example of the addition of a gas or a gas mixture to the discharge may be done for the purpose of deactivating energy stored in the vibration states of molecules. $N_2$ or substitution for such molecules such as $N_2$ absorb much of the discharge energy into their vibrational molecular states. These states have long lifetimes compared to acoustic times, therefore this will severely lower the efficiency of the sound generation. Addition of trace amounts of $CO_2$ or water vapor, which can also result form the addition of trace quantities of $H_2$, will rapidly kinetically deactivate energy stored in the vibrational states of $N_2$ and other molecules. Alternatively, in a closed system argon or some other atomic constituent might be substituted for the $N_2$ or air entirely. The intent of a closed system is to eliminate the $O_2$, thereby eliminating a potential oxidation problem of the electrodes, and also to eliminate ozone production. A substitute attacher would replace the $O_2$ and a substitute for $N_2$ would eliminate vibrational energy piracy.

When the working gas has been modified, deviations in molecular weight would cause sound dispersion at the internal gas-atmosphere interface which may be troublesome. However, the mixture could be made to match the molecular weight of air by the addition of gases like argon.

It will be apparent to those skilled in the art that many changes may be made in the construction and arrangement of parts without departing from the scope of the invention as defined in the appended claims.

I claim:

1. That method of controlling the shape, temperature distribution, pressure, density, and electrical conductivity of a plasma in air which comprises the steps of:
generating a plasma in air in the glow discharge phase and controlling thermal energy flow to and from said plasma thereby forming a hot interior with steep thermal gradients and density gradients in the boundary area of plasma contiguous the ambient air.

2. The method of claim 1 wherein the step of controlling thermal energy flow to and from said plasma comprises applying a heated gas to the plasma.

3. The method of claim 1 wherein the step of controlling thermal energy flow to and from said plasma comprises applying an electric field.

4. The method of claim 2 wherein the step of generating a plasma includes the step of providing a plurality of laterally spaced electrodes of the same polarity to spread the plasma over a desired area.

5. The method of claim 4 including the step of regulating the current flow and density in the plasma.

6. The method of claim 5 including the step of removing thermal energy at a rate which provides an equilibrium system-operating temperature.

7. The method of claim 6 including the step of modulating the plasma in response to a signal where the radiated acoustic power in watts/m² is expressed as:

$$\frac{W}{m^2} = \frac{P_o^2}{4\pi\sqrt{\rho_o B_o}} \left[ \left[ 1 + \left(\frac{2\mu A'}{B'}\left(\frac{\omega}{A'^2 + \omega^2}\right)(e^{-A\tau} - \cos(\omega\tau)) + \frac{2\mu A'^2}{(A^2 + \omega^2)}\sin(\omega\tau)\right)\right]^{\frac{\gamma}{\gamma-1}} - 1 \right]^2$$

where A' is the thermal relaxation time and B' is the energy input.

8. The method of claim 1 wherein the step of generating a plasma in air includes the step of providing an electron beam generator.

9. Apparatus for radiating sound energy comprising:
means for producing plasma in air in the glow discharge phase,
means for controlling the shape, temperature distribution, pressure, density, and electrical conductivity of said plasma to form a sheath having a hot interior with steep thermal gradients and density gradients in the boundary area of said plasma contiguous the ambient air, and
means for modulating said plasma by a signal.

10. The apparatus of claim 9 wherein the said plasma is thin compared to the shortest wavelength to be radiated and is large in area to radiate a desired sound pressure level.

11. The apparatus of claim 10 wherein the means for controlling the shape, temperature distribution, pressure, density, and electrical conductivity of said plasma comprises means to apply a heated gas to said plasma.

12. The apparatus of claim 11 including means for removing heat at a rate which provides an equilibrium system-operating temperature.

13. The apparatus of claim 12 wherein the means for producing plasma in air comprises at least a pair of spaced electrodes, and means to apply a high voltage between said electrodes.

14. The apparatus of claim 13 wherein at least one of said pair of spaced electrodes comprises a plurality of laterally spaced elements.

15. The apparatus of claim 14 wherein the said elements are tubes.

16. The apparatus of claim 15 including means to force the said hot gas through said tubes and into the volume defined by the spaced electrodes.

17. The apparatus of claim 13 wherein at least one of said electrodes comprises an outwardly flaring tubular element.

18. The apparatus of claim 17 including means to force the said hot gas through said tubular element and into the volume between said electrodes.

19. The apparatus of claim 16 wherein the means for removing thermal energy comprises a heat sink, and a fan to force cooling air therethrough.

20. The apparatus of claim 19 wherein the said heat sink comprises a plurality of parallel spaced plates formed from a material having high thermal and electrical conductivity and having said plates electrically insulated one from another.

21. The apparatus of claim 19 wherein the said plates each respectively form a right angle with the axis joining said spaced electrodes.

22. The apparatus of claim 21 including a baffle disposed in said heat sink to simultaneously function to reflect sound energy and to direct cooling air away from the plasma.

23. The apparatus of claim 22 wherein the said hot gas is helium.

24. The apparatus of claim 22 including an acoustical lens to direct the sound energy in a desired direction.

25. The apparatus of claim 24 including means for initating a discharge between the said pair of spaced electrodes.

26. The apparatus of claim 25 wherein the said means for initiating the discharge between said spaced electrodes comprises a circuit including a high voltage source connected to the said heat sink plates to initiate a progressive plate-by-plate discharge.

27. The apparatus of claim 9 wherein the said means for modulating the plasma comprises a circuit including an audio amplifier having its output connected to said means for producing plasma in air.

28. The apparatus of claim 27 wherein the said audio amplifier is a class A amplifier.

29. The apparatus of claim 9 wherein the means for producing plasma in air is an electron beam generator.

30. The apparatus of claim 9 wherein the means for controlling the shape, temperature distribution, pressure, density, and electrical conductivity of said plasma comprises means to apply an electrical field to said plasma and where the radiated acoustic power in watts/m² is expressed as:

$$\frac{W}{m^2} = \frac{P_o^2}{4\pi \sqrt{\rho_o B_o}} \left[ \left[ 1 + \left( \frac{2\mu A'}{B'} \left( \frac{\omega}{A'^2 + \omega^2} \right) (e^{-A\tau} - \cos(\omega\tau)) + \frac{2\mu A'^2}{(A^2 + \omega^2)} \sin(\omega\tau) \right) \right]^{\frac{\gamma}{\gamma-1}} - 1 \right]^2$$

where $A'$ is the thermal relaxation time and $B'$ is the energy input.

31. The apparatus of claim 30 wherein said means for applying an electric field to said plasma comprises an anode and a cathode disposed in said plasma and a circuit including a source of voltage connected to said anode and said cathode.

32. The apparatus of claim 31 wherein said anode and said cathode each comprise a grid structure.

33. The apparatus of claim 31 wherein said anode and said cathode each comprise a plurality of concentric rings.

34. The apparatus of claim 33 wherein said plurality of rings are interdigitated.

35. The apparatus of claim 31 wherein said anode and said cathode each comprise a plurality of parallel spaced plates.

36. The apparatus of claim 35 wherein the said parallel spaced plates are formed into an acoustic lens.

37. The apparatus of claim 31 including a Venturi tube and an electron beam generator connected to said Venturi tube.

* * * * *